(12) United States Patent
Chen et al.

(10) Patent No.: US 10,925,398 B2
(45) Date of Patent: Feb. 23, 2021

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/700,065

(22) Filed: Dec. 2, 2019

(65) Prior Publication Data
US 2020/0390241 A1 Dec. 17, 2020

(30) Foreign Application Priority Data
Jun. 12, 2019 (TW) .................................. 108120605

(51) Int. Cl.
| A47B 88/00 | (2017.01) |
| A47B 88/43 | (2017.01) |
| H05K 7/14  | (2006.01) |

(52) U.S. Cl.
CPC ............ *A47B 88/43* (2017.01); *H05K 7/1489* (2013.01)

(58) Field of Classification Search
CPC ...... H05K 7/1489; A47B 88/43; A47B 88/00; A47B 88/40
See application file for complete search history.

(56) References Cited

U.S. PATENT DOCUMENTS

| 6,230,903 | B1  |   | 5/2001 | Abbott |
| 7,357,362 | B2  |   | 4/2008 | Yang et al. |
| 8,371,454 | B2  |   | 2/2013 | Chen et al. |
| 10,172,458 | B2 |   | 1/2019 | Chen et al. |
| 2003/0111436 | A1 | * | 6/2003 | Basinger .............. H05K 7/1489 211/183 |
| 2009/0166485 | A1 | * | 7/2009 | Chen ...................... A47B 88/43 248/200 |
| 2014/0070064 | A1 | * | 3/2014 | Chen ...................... A47B 88/43 248/221.11 |
| 2017/0079427 | A1 | * | 3/2017 | Chen .................... A47B 88/423 |
| 2018/0220797 | A1 |   | 8/2018 | Chen et al. |

FOREIGN PATENT DOCUMENTS

EP        3449768 A1    3/2019

OTHER PUBLICATIONS

Search Report Issued by a Foreign Patent Office in Application No. (19215511.7-1203) dated Jul. 1, 2020.

* cited by examiner

*Primary Examiner* — Matthew W Ing
(74) *Attorney, Agent, or Firm* — Rosenberg, Klein & Lee

(57) ABSTRACT

A slider rail assembly includes a rail member and a bracket. The bracket and the rail member can be displaced with respect to each other. One of the rail member and the bracket is provided with a blocking feature, and the other of the rail member and the bracket is provided with a locking device. When the bracket is at a predetermined position with respect to the rail member and the locking device is in a locking state, the locking device blocks and is blocked by the blocking feature to prevent the bracket from being displaced from the predetermined position in a certain direction.

19 Claims, 11 Drawing Sheets

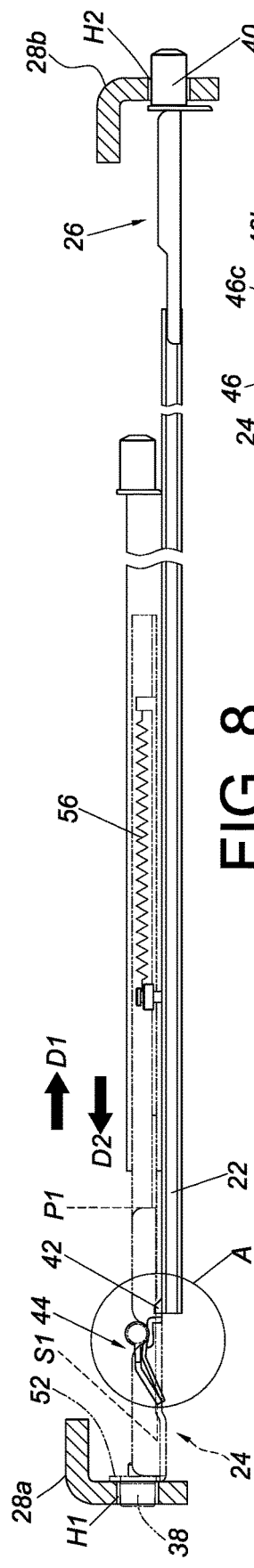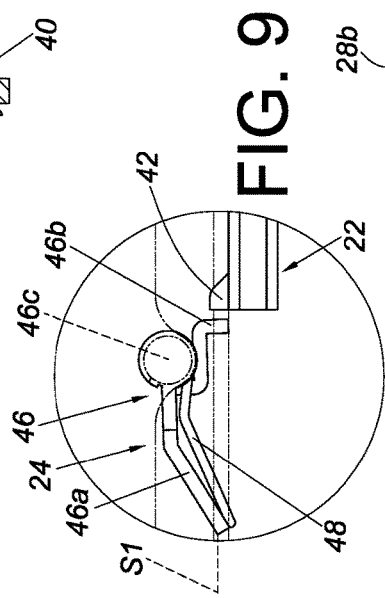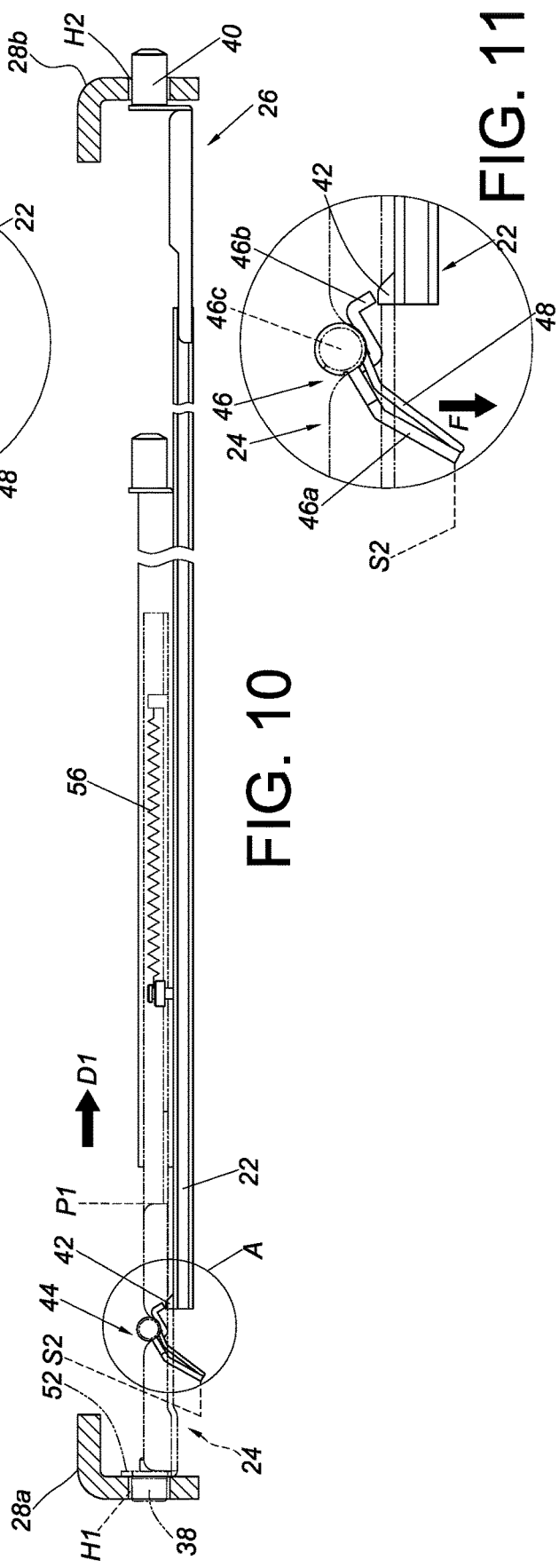

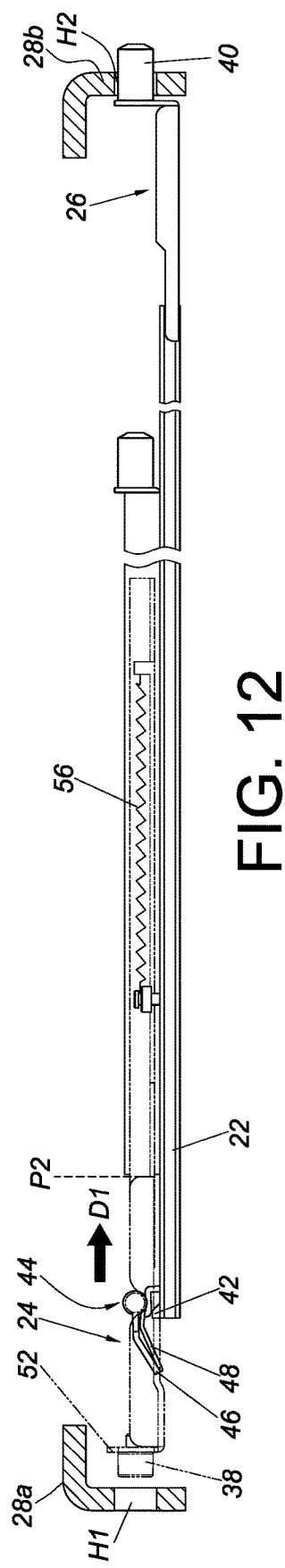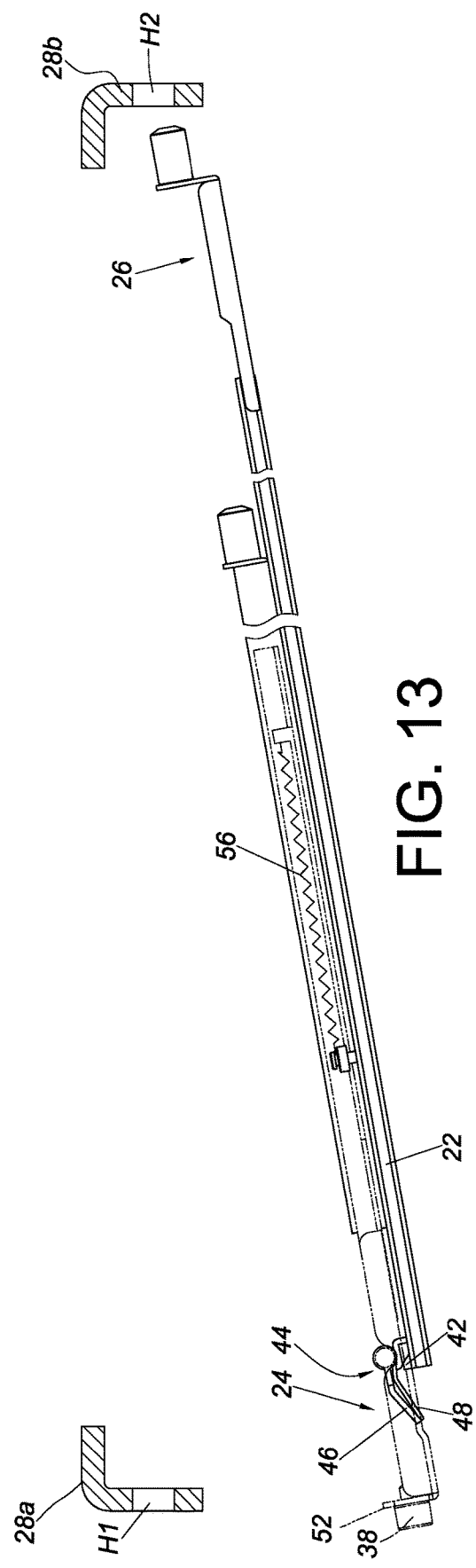

SLIDE RAIL ASSEMBLY

FIELD OF THE INVENTION

The present invention relates to a slide rail and more particularly to a slide rail assembly with a bracket.

BACKGROUND OF THE INVENTION

Brackets are generally used to mount a slide rail assembly to the corresponding posts of a rack. In U.S. Pat. No. 6,230,903 B1, for example, Abbott discloses a slide rail mechanism 21, a first mounting bracket 27, a second mounting bracket 47, a spring 59, and a knob 49. The first mounting bracket 27 is fixedly mounted on the outer rail 23 of the slide rail mechanism 21 at a position adjacent to the first end of the outer rail 23. The second mounting bracket 47 is movably mounted on the outer rail 23 of the slide rail mechanism 21 at a position adjacent to the second end of the outer rail 23. The spring 59 applies an elastic force to the second mounting bracket 47 such that the second mounting bracket 47 is biased either toward the first mounting bracket 27 (as shown in FIG. 1 to FIG. 4 accompanying the specification of the '903 B1 patent) or away from the first mounting bracket 27 (as in the alternative mounting method shown in FIG. 5 of the '903 B1 patent). Once the slide rail mechanism 21 is mounted on the corresponding posts 13L and 15L of a rack system 10 via the first mounting bracket 27, the second mounting bracket 47, and the spring 59, the knob 49 must be tightened in order to lock the second mounting bracket 47 to the outer rail 23 of the slide rail mechanism 21 and thereby complete the mounting and positioning process. When it is desired to detach the slide rail mechanism 21 from the posts 13L and 15L of the rack system 10, the second mounting bracket 47 must be unlocked from the outer rail 23 of the slide rail mechanism 21 by loosening the knob 49. The tightening and loosening operations of the knob 49, however, are extremely inconvenient: the operator has to insert his or her hands into the rack system 10 through tiny spaces not only because the knob 49 is located inside the rack system 10 and spaced apart from the post 13L of the rack system 10 after the slide rail mechanism 21 is mounted on the rack system 10 (as is clearly shown in the drawings of the '903 B1 patent), but also because a side plate is typically provided between the posts 13L and 15L of the rack system 10. The aforesaid inconvenience of operation needs to be addressed.

U.S. Pat. No. 7,357,362 B2 discloses a bracket positioning structure for a slide rail. The bracket positioning structure includes a plurality of studs and a connecting element. The studs are disposed on a bracket and are configured to be mounted in the corresponding holes of a supporting post respectively. The connecting element has at least one tooth for engaging with the supporting post and thereby preventing the bracket from being displaced from a certain position in a certain direction, lest the studs separate from the corresponding holes of the supporting post in that direction (see FIG. 5 accompanying the specification of the '362 B2 patent).

U.S. Pat. No. 8,371,454 B2 discloses a bracket assembly. The bracket assembly includes a plurality of mounting members and a fastening arm. The mounting members are configured to be mounted in the corresponding holes of a post respectively. The fastening arm has a fastening portion configured to be hooked to the post and thereby prevent the bracket from being displaced from a certain position in a certain direction, lest the mounting members separate from the corresponding holes of the post in that direction (see FIG. 8 accompanying the specification of the '454 B2 patent).

It can be known from the above that the subject matters of U.S. Pat. Nos. 7,357,362 B2 and 8,371,454 B2, which are related to each other, have either a connecting element or a fastening arm fastened to a post of a rack to prevent a bracket from being displaced from a certain position in a certain direction. Sometimes, however, the user of a slide rail assembly may not want the bracket(s) of the slide rail assembly to be locked in this way. It is therefore worthwhile to develop a slide rail product having a different bracket locking design.

SUMMARY OF THE INVENTION

The present invention provides a slide rail assembly having a bracket.

According to one aspect of the present invention, a slide rail assembly includes a rail member and a first bracket. The first bracket and the rail member can be displaced with respect to each other. One of the rail member and the first bracket is provided with a blocking feature (hereinafter referred to as the first blocking feature for the sake of clarity), and the other of the rail member and the first bracket is provided with a locking device. The locking device has a locking state. When the first bracket is at a predetermined position with respect to the rail member and the locking device is in the locking state, the locking device blocks and is blocked by the first blocking feature to prevent the first bracket from being displaced from the predetermined position in a first direction.

Preferably, the one of the rail member and the first bracket is further provided with a second blocking feature, and when the first bracket is at the predetermined position with respect to the rail member and the locking device is in the locking state, the locking device blocks and is blocked by the second blocking feature to prevent the first bracket from being displaced from the predetermined position in a second direction, which is the opposite direction of the first direction.

Preferably, the locking device further has an unlocking state, and when the first bracket is at the predetermined position with respect to the rail member and the locking device is in the unlocking state, the locking device does not block and is not blocked by the first blocking feature such that the first bracket is allowed to be displaced from the predetermined position in the first direction.

Preferably, the locking device further has an unlocking state, and when the first bracket is at the predetermined position with respect to the rail member and the locking device is in the unlocking state, the locking device does not block and is not blocked by the first blocking feature or the second blocking feature.

Preferably, the locking device includes a locking member and an elastic portion, and the locking member stays in the locking state in response to an elastic force of the elastic portion.

Preferably, the locking member is pivotally connected to the first bracket.

Preferably, the rail member is provided with an auxiliary base. The auxiliary base includes a channel, and the first bracket can be displaced with respect to the rail member through the channel.

Preferably, the slide rail assembly further includes an elastic member for applying to the first bracket an elastic force that acts in the second direction (i.e., the opposite direction of the first direction).

Preferably, the locking member includes a locking portion and a fastening portion, and when the locking member is in the locking state, the locking portion blocks and is blocked by the blocking feature, with the fastening portion fastened to the first post. Alternatively, the locking portion is disposed on the elastic portion such that the locking member blocks and is blocked by the blocking feature through the locking portion of the elastic portion when in the locking state.

Preferably, the slide rail assembly is adapted for a first post and a second post of a rack further includes a second bracket. The second bracket is disposed on the rail member. The first bracket and the second bracket are configured to mount the rail member to the first post and the second post respectively. The first bracket includes at least one first mounting member, which is inserted in at least one first corresponding feature of the first post when the first bracket is at a predetermined position with respect to the rail member. When in the locking state, the locking device blocks and is blocked by the blocking feature to prevent the first bracket from being displaced from the predetermined position in a first direction, lest the at least one first mounting member of the first bracket separate from the at least one first corresponding feature of the first post.

Preferably, when the first bracket is at the predetermined position with respect to the rail member, the first post blocks the first bracket from being displaced in a second direction, which is the opposite direction of the first direction.

Preferably, the second bracket includes at least one second mounting member, which is configured to be inserted in at least one second corresponding feature of the second post.

Preferably, the first bracket is adjacent to an end portion of the rail member, and the second bracket is disposed on the rail member and is spaced apart from the end portion of the rail member.

Preferably, when the first bracket is at the predetermined position with respect to the rail member and the locking device is in the unlocking state, the locking device does not block and is not blocked by the blocking feature such that the first bracket is allowed to be displaced from the predetermined position in the first direction to separate the at least one first mounting member of the first bracket from the at least one first corresponding feature of the first post.

Preferable, the elastic member is configured for applying an elastic force to the first bracket and thereby pressing the first bracket against the first post in the second direction.

According another aspect of the present invention, a slide rail assembly includes a rail member, a first bracket, a second bracket, and an elastic member. The first bracket is disposed adjacent to an end portion of the rail member, includes at least one first mounting member, and can be displaced with respect to the rail member. The second bracket is disposed away from the end portion of the rail member and includes at least one second mounting member. The elastic member applies an elastic force to the first bracket.

Preferably, the slide rail assembly further includes a locking device, and the locking device has a locking state and an unlocking state. When the first bracket is at a predetermined position with respect to the rail member and the locking device is in the locking state, the locking device and the rail member are in an interfering relationship that prevents the locking device from being displaced in a first direction; meanwhile, the elastic member applies to the first bracket an elastic force that acts in a second direction, which is the opposite direction of the first direction.

Preferably, when the first bracket is at the predetermined position with respect to the rail member and the locking device is in the unlocking state, the locking device and the rail member are not in the aforesaid interfering relationship such that the locking device is allowed to be displaced in the first direction.

BRIEF DESCRIPTION OF THE DRAWINGS

FIG. 8 is a schematic view of the slide rail assembly according to the first embodiment of the present invention, showing the slide rail assembly mounted on a first post and a second post of the rack, with the locking device in the locking state;

FIG. 9 is an enlarged view of the circled area A in FIG. 8;

FIG. 10 is a schematic view of the slide rail assembly according to the first embodiment of the present invention, showing the slide rail assembly mounted on a first post and a second post of the rack, with the locking device in the unlocking state;

FIG. 11 is an enlarged view of the circled area A in FIG. 10;

FIG. 12 is a schematic view of the slide rail assembly according to the first embodiment of the present invention, showing that the first bracket of the slide rail assembly is at the second predetermined position and detached from the first post while the second bracket remains mounted on the second post;

FIG. 13 is a schematic view of the slide rail assembly according to the first embodiment of the present invention, showing that both the first bracket and the second bracket of the slide rail assembly are detached from the rack;

DETAILED DESCRIPTION OF THE INVENTION

Figure 1:
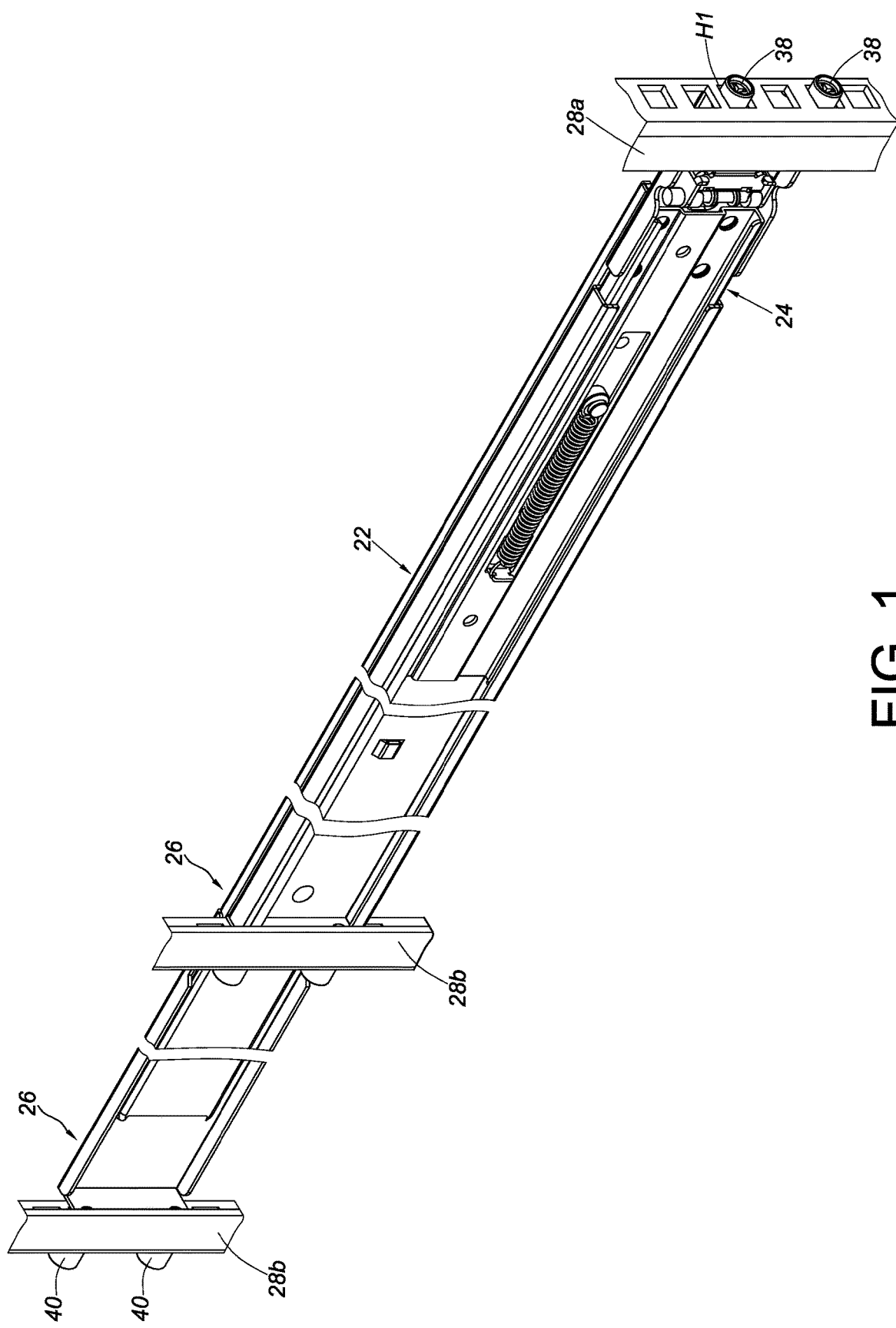
FIG. 1 is a perspective view of the slide rail assembly according to a first embodiment of the present invention, showing the slide rail assembly mounted on a rack.

Referring to FIG. 1, the slide rail assembly according to the first embodiment of the present invention includes a rail member 22 mounted on a first post 28a and at least one second post 28b of a rack via a first bracket 24 and at least one second bracket 26 respectively. In this embodiment, there are two second brackets 26 for use respectively with two second posts 28b by way of example. In other embodiments, there may be only one second bracket 26 for use with a single second post 28b. The present invention has no limitation on the number of the second brackets 26 and of the second posts 28b.

Figure 2:
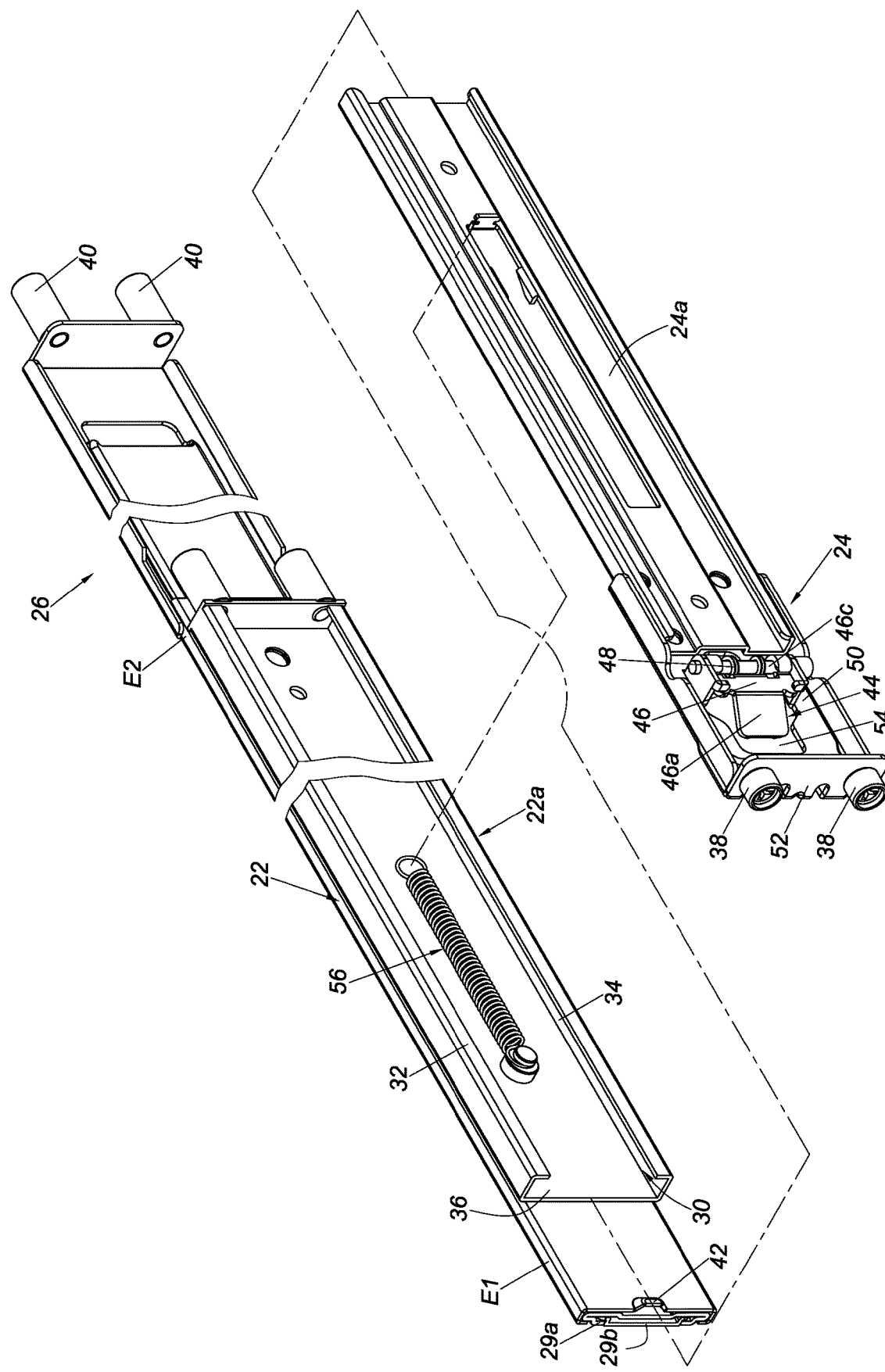
FIG. 2 is an exploded perspective view of the slide rail assembly according to the first embodiment of the present invention, showing the first bracket separated from the second brackets.
Figure 3:
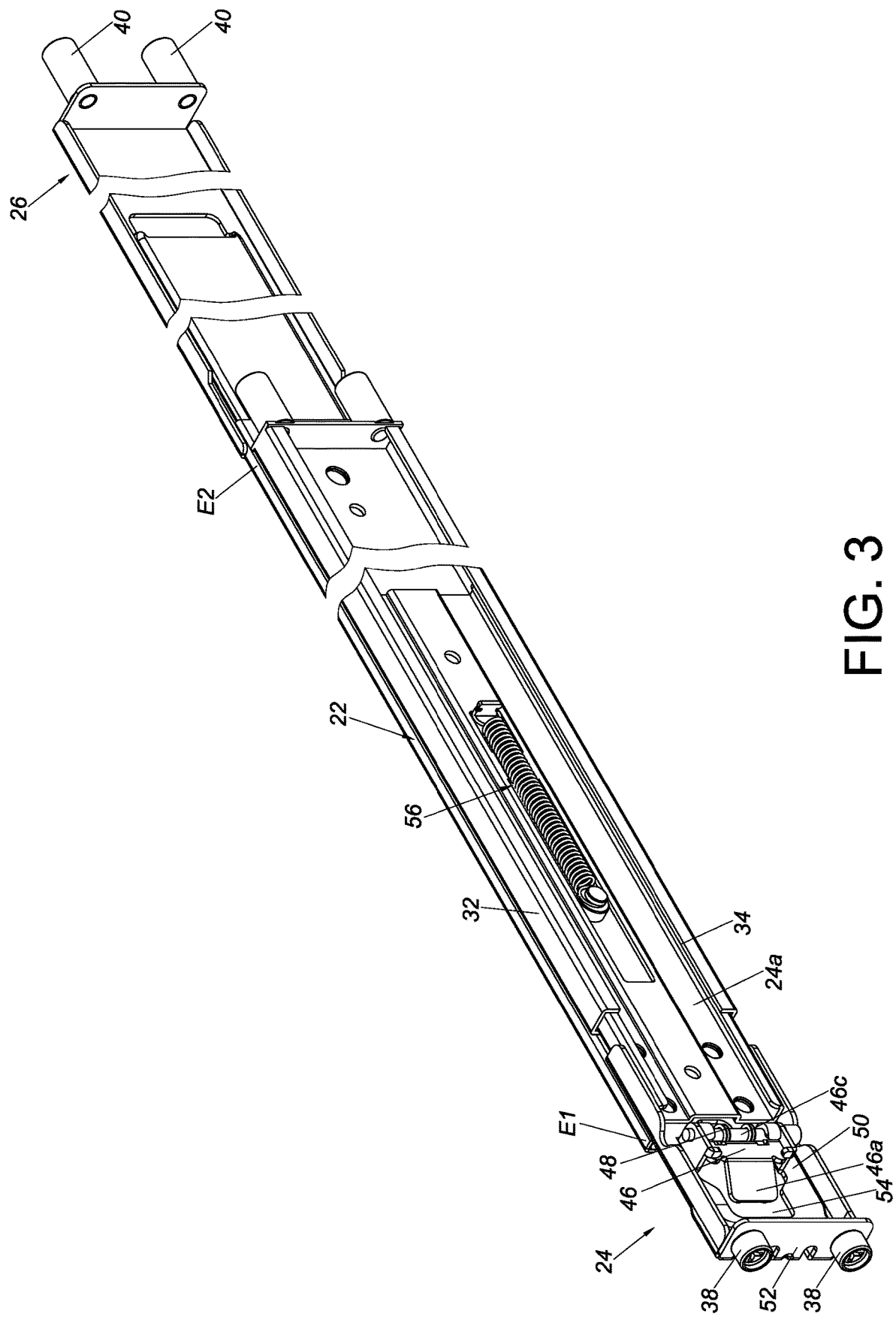
FIG. 3 is an assembled perspective view of the slide rail assembly according to the first embodiment of the present invention, showing the first and second brackets are assembled.
Figure 4:
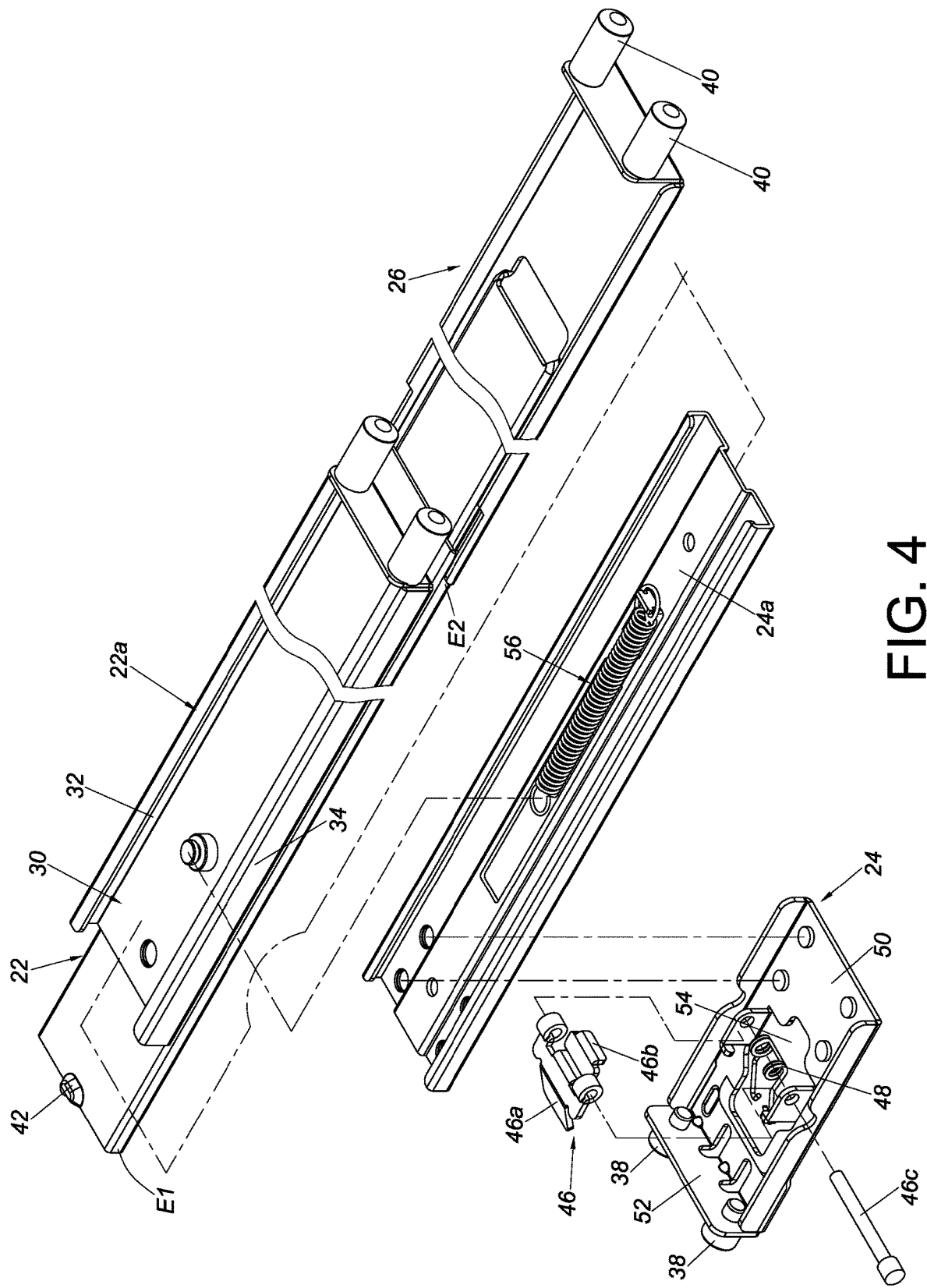
FIG. 4 shows the slide rail assembly according to the first embodiment of the present invention, with the first bracket not only detached from the rest of the slide rail assembly (including the second brackets), but also shown in an exploded view.

Referring to FIG. 2, FIG. 3, and FIG. 4, the first bracket 24 and the rail member 22 can be displaced with respect to each other. Preferably, the rail member 22 is provided with an auxiliary base 22a, which in this embodiment is fixedly connected to the rail member 22 and therefore can be viewed as a part of the rail member 22. Preferably, the auxiliary base 22a is disposed on a first side of the rail member 22, and a plurality of movable rails (e.g., a first movable rail 29a and a second movable rail 29b) are disposed on a second side of the rail member 22 and can be displaced with respect to the rail member 22.

The auxiliary base 22a includes a channel 30. For example, the auxiliary base 22a has a first wall 32, a second wall 34, and a longitudinal wall 36 connected between the first wall 32 and the second wall 34 of the auxiliary base 22a, and the channel 30 is defined jointly by the first wall 32, the second wall 34, and the longitudinal wall 36 of the auxiliary base 22a. Preferably, the first bracket 24 includes an extension supporting member 24a received in the channel 30 of the auxiliary base 22a and thus rendering the first bracket 24 displaceable with respect to the rail member 22, wherein the extension supporting member 24a is fixed to the first bracket 24 and hence can be viewed as a part of the first bracket 24. Here, the first bracket 24 is adjacent to an end portion E1 of the rail member 22 by way of example. In addition, the first bracket 24 includes at least one first mounting member 38. The second bracket 26, on the other hand, is disposed on the rail member 22 at positions away from the end portion E1 of the rail member 22 (e.g., are disposed at the opposite end portion E2 of the rail member 22) and includes at least one second mounting member 40.

One of the rail member 22 and the first bracket 24 is provided with a blocking feature 42, and the other of the rail member 22 and the first bracket 24 is provided with a locking device 44. Here, by way of example only, it is the rail member 22 that is provided with the blocking feature 42, and it is the first bracket 24 that is provided with the locking device 44.

Preferably, the blocking feature 42 is disposed adjacent to the end portion E1 of the rail member 22 and is a predetermined structure such as but not limited to a projection or a wall. The locking device 44 includes a locking member 46 and an elastic portion 48. The locking member 46 stays in a certain state in response to the elastic force applied by the elastic portion 48 to the locking member 46. In this embodiment, the elastic portion 48 is a torsion spring by way of example; in an alternative embodiment, the elastic portion 48 may be an elastic plate, a flexible object, or a similar elastic component without limitation.

Preferably, the locking member 46 includes an operating portion 46a and a locking portion 46b, with a shaft 46c disposed between the operating portion 46a and the locking portion 46b to pivotally connect the locking member 46 to the first bracket 24.

Preferably, the first bracket 24 includes a sidewall 50 and an end wall 52 substantially perpendicularly connected to the sidewall 50. The sidewall 50 has an opening 54 that brings two opposite sides of the first bracket 24 into communication, and the locking member 46 corresponds in position to the opening 54. The at least one first mounting member 38 is disposed at the end wall 52.

Preferably, the slide rail assembly further includes an elastic member 56 for applying an elastic force to the first bracket 24. Here, the elastic member 56 has two portions connected respectively to the auxiliary base 22a of the rail member 22 and the extension supporting member 24a of the first bracket 24 by way of example.

Figure 5:
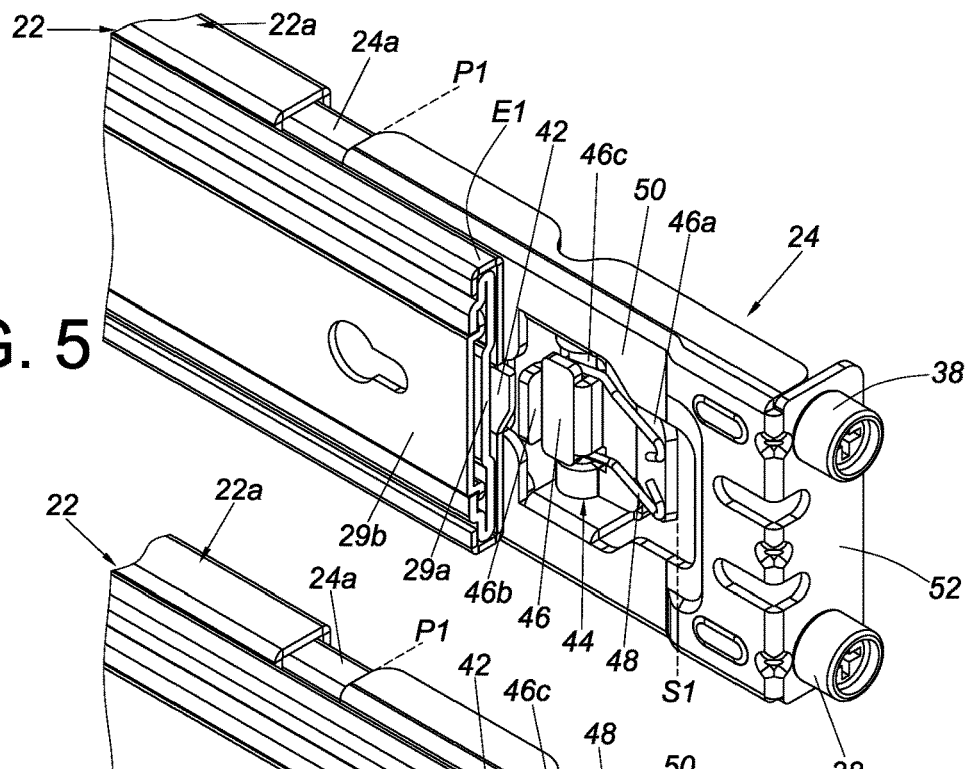
FIG. 5 is a schematic view of the slide rail assembly according to the first embodiment of the present invention, showing the first bracket at a predetermined position with respect to the rail member.
Figure 6:
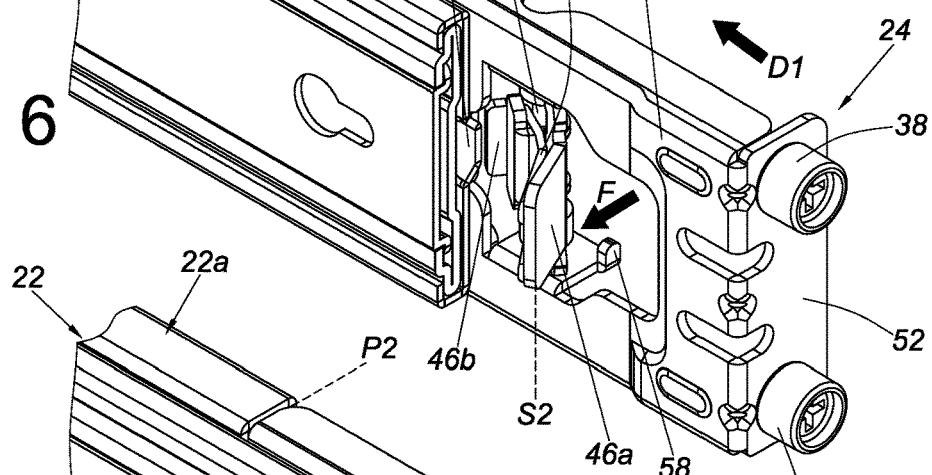
FIG. 6 is a schematic view of the slide rail assembly according to the first embodiment of the present invention, showing the locking device operated and thus switched from a locking state to an unlocking state.

Referring to FIG. 5, the locking device 44 has a locking state S1. For example, the locking member 46 of the locking device 44 stays in the locking state S1 in response to the elastic force of the elastic portion 48. When the first bracket 24 is at a predetermined position P1 (e.g., an extended position) with respect to the rail member 22 and the locking device 44 is in the locking state S1, the locking device 44 blocks and is blocked by the blocking feature 42 such that the first bracket 24 is kept from being displaced from the predetermined position P1 in a first direction D1 (which direction is indicated in FIG. 6). More specifically, when the locking member 46 is in the locking state S1, the locking portion 46b of the locking member 46 corresponds in position to the blocking feature 42 of the rail member 22; as a result, the blocking feature 42 of the rail member 22 blocks the locking portion 46b of the locking member 46 and thereby prevents the first bracket 24 from being displaced with respect to the rail member 22 from the predetermined position P1 in the first direction D1.

Figure 7:
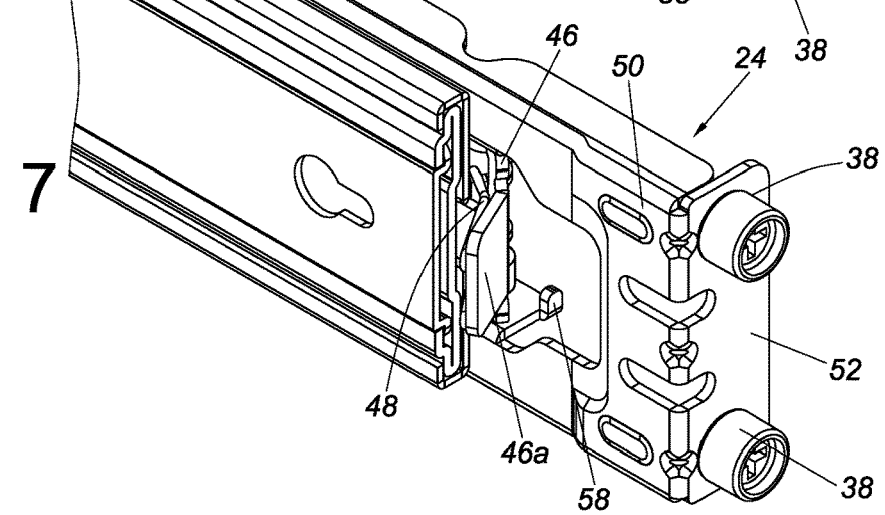
FIG. 7 is a schematic view of the slide rail assembly according to the first embodiment of the present invention, showing the first bracket displaced with respect to the rail member from the predetermined position to another predetermined position in a first direction.

Referring to FIG. 6 and FIG. 7, the locking device 44 further has an unlocking state S2. When the first bracket 24 is at the predetermined position P1 with respect to the rail member 22, the locking device 44 can be switched to the unlocking state S2 so that the locking device 44 and the blocking feature 42 are no longer blocked by each other, the objective being to allow the first bracket 24 to be displaced from the predetermined position P1 in the first direction D1. More specifically, a force F can be applied to the operating portion 46a of the locking member 46 of the locking device 44 to pivot the locking member 46 through an angle such that the locking portion 46b of the locking member 46 no longer corresponds in position to, and therefore is no longer blocked by, the blocking feature 42 of the rail member 22, allowing the first bracket 24 to be displaced with respect to the rail member 22 from the predetermined position P1 to another predetermined position P2 (e.g., a retracted position) in the first direction D1.

It is worth mentioning that the first bracket 24 further includes a position limiting portion 58. When the first bracket 24 is at the predetermined position P1, the locking member 46 in the locking state S1 is pressed against the position limiting portion 58.

Referring to FIG. 8 and FIG. 9, the rail member 22 is mounted on the first post 28a and the second post 28b via the first bracket 24 and the second bracket 26 respectively. More specifically, the first bracket 24 in FIG. 8 is at the predetermined position P1 with respect to the rail member 22, with the at least one first mounting member 38 inserted in the at least one first corresponding feature H1 (e.g., at least one first hole) of the first post 28a. Furthermore, with the locking device 44 in the locking state S1, the locking member 46 of the locking device 44 blocks and is blocked by the blocking feature 42 (i.e., the locking device 44 in the locking state S1 and the rail member 22 are now in an interfering relationship that prevents displacement of the locking device 44 in the first direction D1) to keep the first bracket 24 from being displaced from the predetermined position P1 in the first direction D1, lest the at least one first mounting member 38 of the first bracket 24 separate from the at least one first corresponding feature H1 of the first post 28a. In addition, the first post 28a blocks the first bracket 24 from being displaced in a second direction D2 (which is the opposite direction of the first direction D1) when the first bracket 24 is at the predetermined position P1 with respect to the rail member 22. More specifically, the elastic member 56 applies to the first bracket 24 an elastic force that acts in the second direction D2 and hence biases the first bracket 24 in the second direction D2; as a result, the end wall 52 of the first bracket 24 is pressed against the first post 28a in the second direction D2 to help mount the at least one first mounting member 38 of the first bracket 24 securely or reliably to the at least one first corresponding feature H1 of the first post 28a. For example, the elastic force of the elastic member 56 enables the at least one first mounting member 38 of the first bracket 24 to stay inserted in the at least one first corresponding feature H1 of the first post 28a. The second bracket 26 in FIG. 8 has the at least one second mounting member 40 inserted in the at least one second corresponding feature H2 (e.g., at least one second hole) of the second post 28b.

Referring to FIG. 10 and FIG. 11, when it is desired to detach the rail member 22 from the first post 28a, a user can apply the force F so that the locking member 46 of the locking device 44 is pivoted through an angle and thereby switched from the locking state S1 to the unlocking state S2 (see FIG. 11), in which state the locking portion 46b of the locking member 46 does not correspond in position to, and therefore is not blocked by, the blocking feature 42 of the rail member 22 (i.e., the locking device 44 in the unlocking state S2 and the rail member 22 are not in the aforesaid interfering relationship, which prevents displacement of the locking device 44 in the first direction D1); consequently, the first bracket 24 is allowed to be displaced with respect to the rail member 22 from the predetermined position P1 to the predetermined position P2 (see FIG. 12) in the first direction D1 to separate the at least one first mounting member 38 of the first bracket 24 from the at least one first corresponding feature H1 of the first post 28a.

Once the at least one first mounting member 38 of the first bracket 24 is separated from the at least one first corresponding feature H1 of the first post 28a, referring to FIG. 13, the at least one second mounting member 40 of the second bracket 26 can be separated from the at least one second corresponding feature H2 of the second post 28b such that the rail member 22 is detached from the rack. It is worth mentioning that the rail member 22 can be remounted to the rack by performing the steps of FIG. 8, FIG. 10, and FIG. 12 in the reverse order, and for the sake of brevity, the remounting process will not be described any further.

Figure 14:
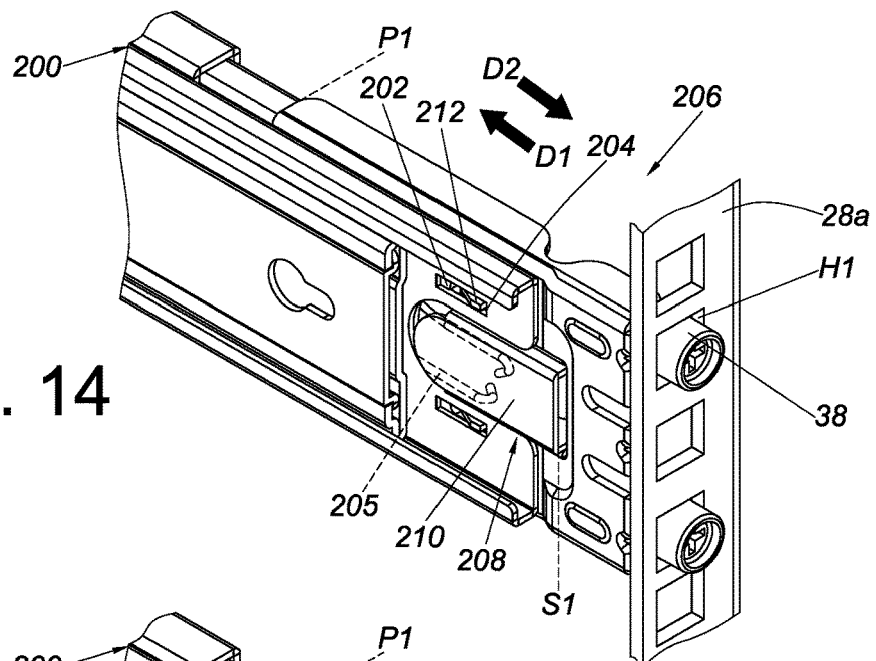
FIG. 14 is a schematic view of the slide rail assembly according to a second embodiment of the present invention, showing the first bracket at a predetermined position with respect to the rail member and mounted on the first post.

FIG. 14 shows the rail member 200 of the slide rail assembly according to the second embodiment of the present invention. Unlike the rail member 22 in the first embodiment, which is provided with one blocking feature 42, the rail member 200 in the second embodiment is provided with two blocking features such as a first blocking feature 202 and a second blocking feature 204.

More specifically, when the first bracket 206 is at the predetermined position P1 with respect to the rail member 200 and the locking member 210 of the locking device 208 is in the locking state S1 in response to the elastic force of the elastic portion 205, the locking portion 212 of the locking member 210 blocks and is blocked by one of the blocking features (e.g., the first blocking feature 202) to prevent the first bracket 206 from being displaced from the predetermined position P1 in the first direction D1. In addition, when the first bracket 206 is at the predetermined position P1 with respect to the rail member 200 and the locking device 208 is in the locking state S1, the locking portion 212 of the locking member 210 blocks and is blocked by the other blocking feature (e.g., the second blocking feature 204) to prevent the first bracket 206 from being displaced from the predetermined position P1 in the second direction D2.

It can be known from the above that the first bracket 206 in the second embodiment is blocked in two directions instead of one (as in the first embodiment) when at the predetermined position P1 with respect to the rail member 200. This configuration prevents the first bracket 206 from arbitrary displacement from the predetermined position P1 in either of the first direction D1 and the second direction D2 and therefore contributes to mounting the first bracket 206 (or more particularly the at least one first mounting member 38 of the first bracket 206) securely or reliably to the first post 28a (or more particularly the at least one first corresponding feature H1 of the first post 28a).

Figure 15:
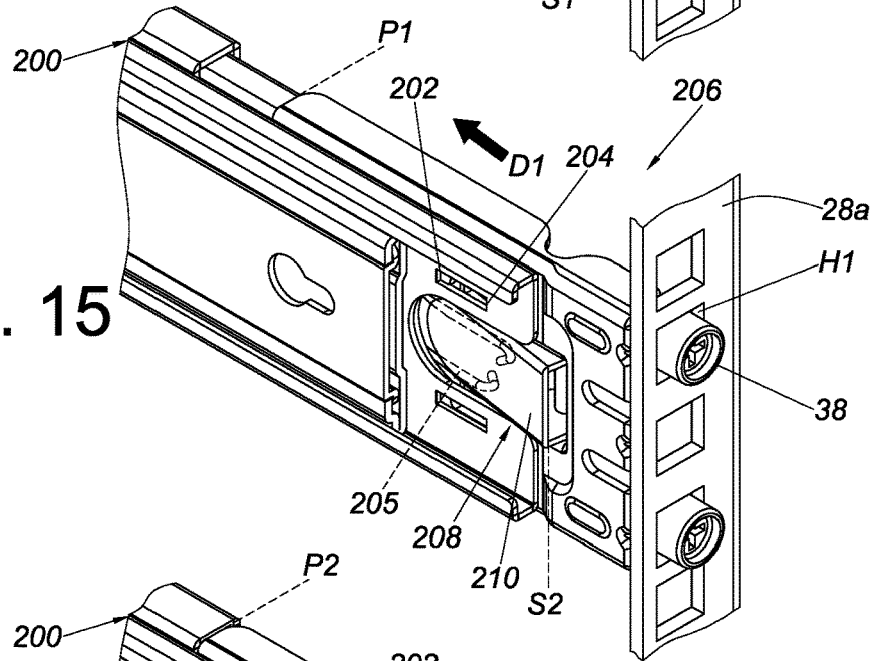
FIG. 15 is a schematic view of the slide rail assembly according to the second embodiment of the present invention, showing the locking device operated and thus switched to an unlocking state.
Figure 16:
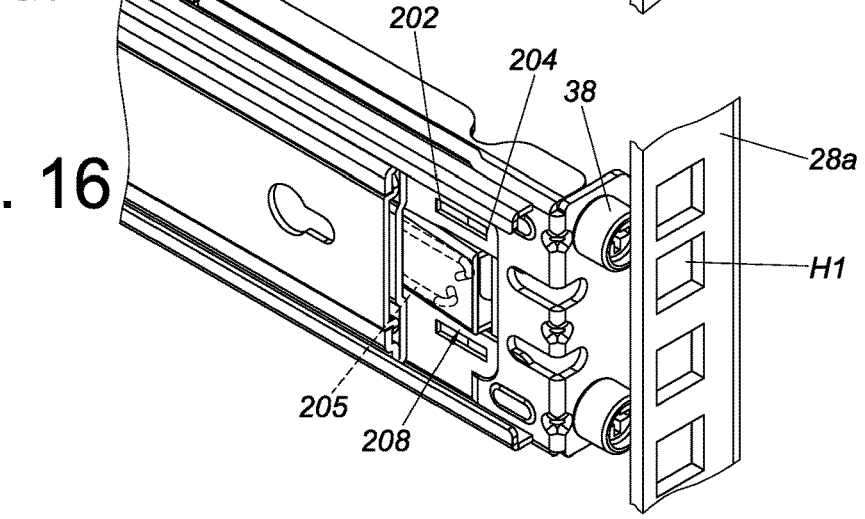
FIG. 16 is a schematic view of the slide rail assembly according to the second embodiment of the present invention, showing the first bracket displaced with respect to the rail member from the predetermined position to another predetermined position in the first direction.

Once the locking device 208 is switched from the locking state S1 to the unlocking state S2, referring to FIG. 15 and FIG. 16, mutual blockage between the locking portion 212 (see FIG. 14) of the locking member 210 of the locking device 208 and the first and the second blocking features 202 and 204 exists no more, so the first bracket 206 can be displaced with respect to the rail member 200 from the predetermined position P1 to the predetermined position P2 in the first direction D1, thereby allowing the at least one first mounting member 38 of the first bracket 206 to be separated from the at least one first corresponding feature H1 of the first post 28a in the first direction D1.

Figure 17:
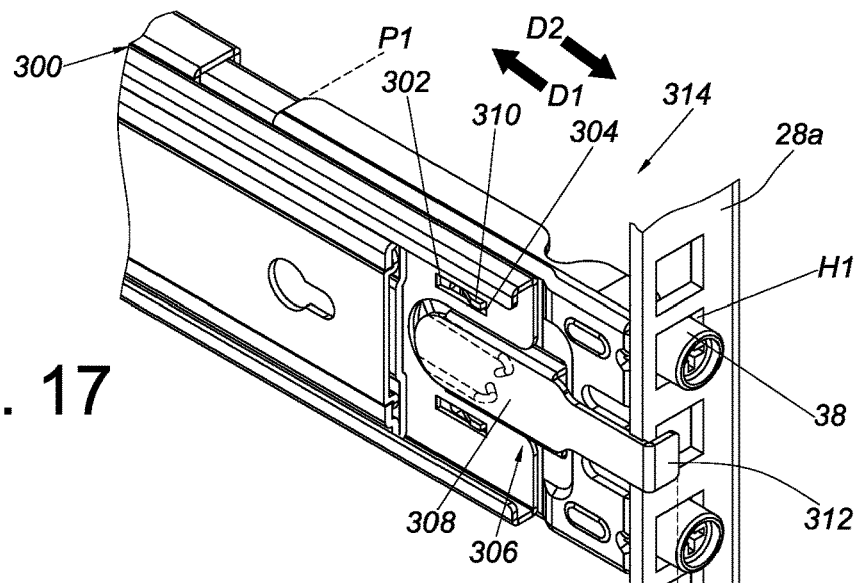
FIG. 17 is a schematic perspective view of the slide rail assembly according to a third embodiment of the present invention, showing the first bracket at a predetermined position with respect to the rail member and mounted on the first post.

FIG. 17 shows the rail member 300 of the slide rail assembly according to the third embodiment of the present invention. Like the second embodiment, in which the locking portion 212 of the locking device 208 is blocked in two directions respectively by the first blocking feature 202 and the second blocking feature 204 when the first bracket 206 is at the predetermined position P1 with respect to the rail member 200 and the locking device 208 is in the locking state S1, the third embodiment creates bidirectional blockage through the collaboration between two blocking features (e.g., a first blocking feature 302 and a second blocking feature 304) of the rail member 300 and the locking portion 310 of the locking member 308 of the locking device 306 when the locking device 306 is in the locking state S1. The third embodiment, however, is different from the second embodiment in that the locking member 308 further includes a fastening portion 312.

When the locking member 308 is in the locking state S1, the locking portion 310 of the locking member 308 blocks and is blocked by the two blocking features 302 and 304 to provide a first safety mechanism. Furthermore, the fastening portion 312 corresponds to the end wall of the first bracket 314 and is fastened to the first post 28a to provide a second safety mechanism. The two safety mechanisms prevent the at least one first mounting member 38 of the first bracket 314 from separating from the at least one first corresponding feature H1 of the first post 28a when the first bracket 314 is at the predetermined position P1 with respect to the rail member 300, and this contributes to mounting the at least one first mounting member 38 of the first bracket 314 securely or reliably to the at least one first corresponding feature H1 of the first post 28a.

Figure 18:
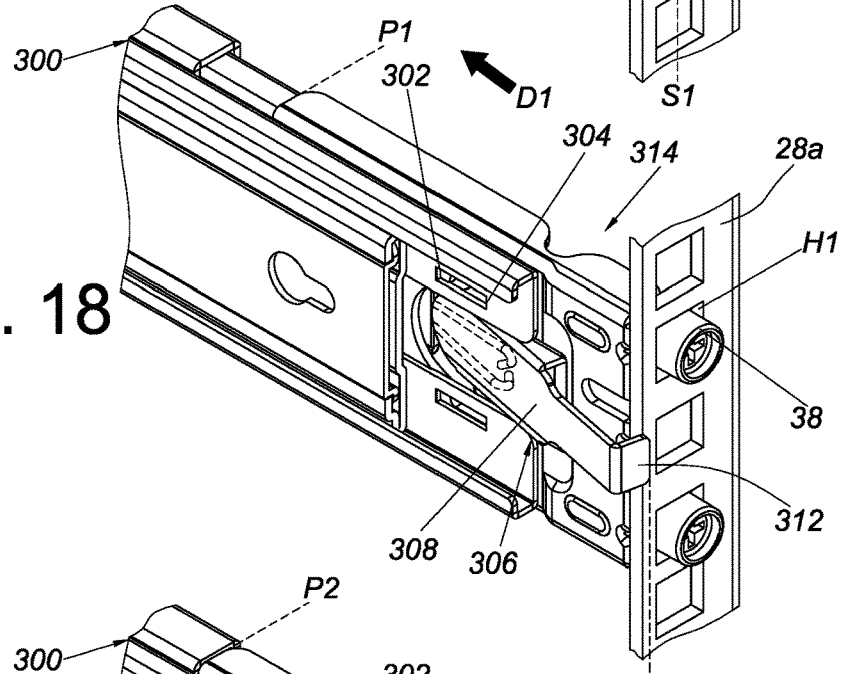
FIG. 18 is a schematic perspective view of the slide rail assembly according to the third embodiment of the present invention, showing the locking device operated and thus switched to an unlocking state.
Figure 19:
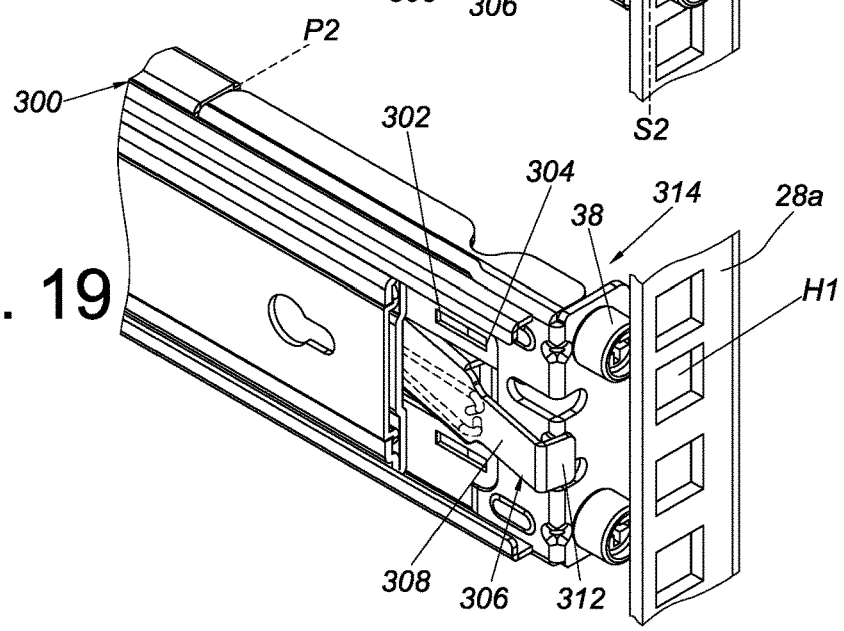
FIG. 19 is a schematic perspective view of the slide rail assembly according to the third embodiment of the present invention, showing the first bracket displaced with respect to the rail member from the predetermined position to another predetermined position in the first direction.

Once the locking device 306 is switched from the locking state S1 to the unlocking state S2, referring to FIG. 18 and FIG. 19, mutual blockage between the locking portion 310 (see FIG. 17) of the locking member 308 of the locking device 306 and the two blocking features 302 and 304 exists no more, and the fastening portion 312 no longer corresponds to the end wall of the first bracket 314 and is therefore no longer fastened to the first post 28a (see FIG. 18). As a result, the first bracket 314 can be displaced with respect to the rail member 300 from the predetermined position P1 to the predetermined position P2 in the first direction D1 (see FIG. 19), allowing the at least one first mounting member 38 of the first bracket 314 to be separated from the at least one first corresponding feature H1 of the first post 28a.

Figure 20:
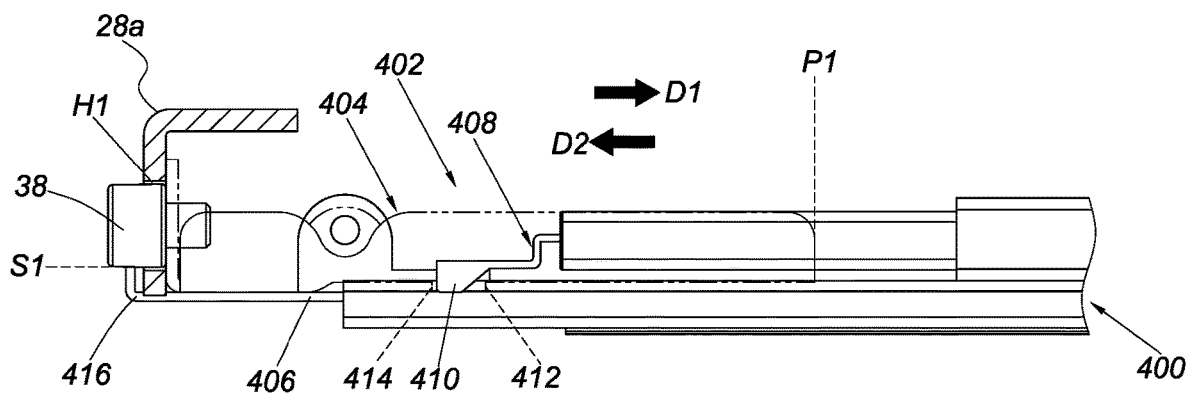
FIG. 20 is a schematic drawing of the slide rail assembly according to a fourth embodiment of the present invention, showing the first bracket at a predetermined position with respect to the rail member and mounted on the first post.

FIG. 20 shows the rail member 400 of the slide rail assembly according to the fourth embodiment of the present invention. Unlike the first to the third embodiments, the fourth embodiment is so designed that the locking portion 410 is not a portion of the locking member 406 of the locking device 404 but a portion of the elastic portion 408 (i.e., the elastic portion 408 has the locking portion 410), and that when the first bracket 402 is at the predetermined position P1 with respect to the rail member 400 and the locking device 404 is in the locking state S1, the locking member 406 of the locking device 404 blocks and is blocked by the first blocking feature 412 and the second blocking feature 414 of the rail member 400 through the locking portion 410 of the elastic portion 408, thereby preventing the first bracket 402 from being displaced from the predetermined position P1 in either of the first direction D1 and the second direction D2. The elastic portion 408 in this embodiment is an elastic plate or flexible object by way of example; the present invention has no limitation in this regard. Preferably, the locking member 406 has a fastening portion 416 configured to be fastened to the first post 28a.

Figure 21:
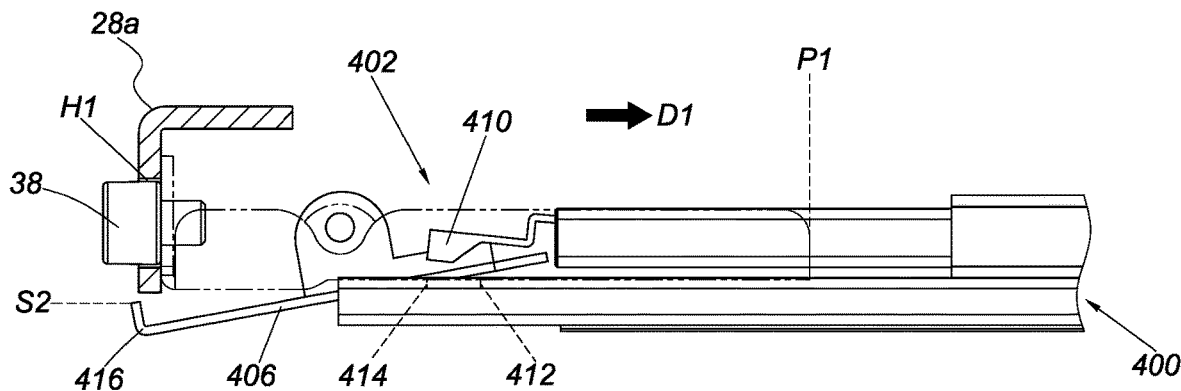
FIG. 21 is a schematic drawing of the slide rail assembly according to the fourth embodiment of the present invention, showing the locking device operated and thus switched to an unlocking state.
Figure 22:
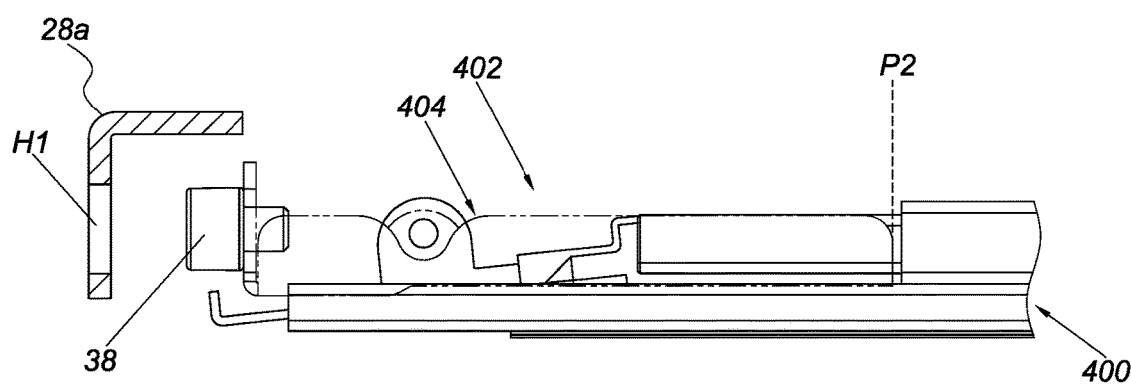
FIG. 22 is a schematic drawing of the slide rail assembly according to the fourth embodiment of the present invention, showing the first bracket displaced with respect to the rail member from the predetermined position to another predetermined position in the first direction.

Once the locking device 404 is switched from the locking state S1 to the unlocking state S2, referring to FIG. 21 and FIG. 22, the locking member 406 of the locking device 404 is no longer blocked by the two blocking features 412 and 414 through the locking portion 410 of the elastic portion 408, and the fastening portion 416 is no longer fastened to the first post 28a (see FIG. 21). Consequently, the first bracket 402 can be displaced with respect to the rail member 400 from the predetermined position P1 to the predetermined position P2 in the first direction D1, allowing the at least one first mounting member 38 of the first bracket 402 to be separated from the at least one first corresponding feature H1 of the first post 28a in the first direction D1 (see FIG. 22).

Figure 23:
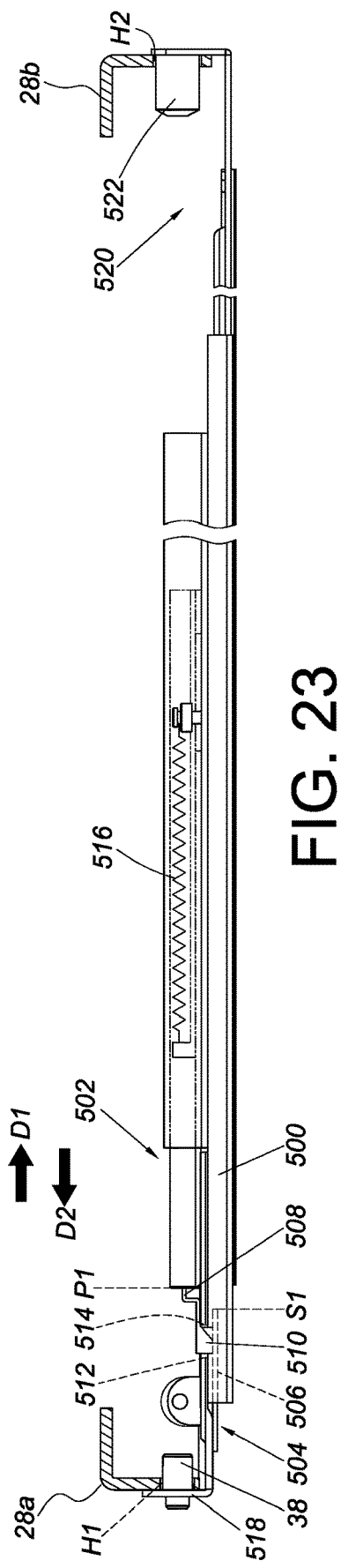
FIG. 23 is a schematic drawing of the slide rail assembly according to a fifth embodiment of the present invention, showing the slide rail assembly mounted on the first post and the second post of the rack, with the locking device in the locking state.

FIG. 23 shows the rail member 500 of the slide rail assembly according to the fifth embodiment of the present invention. Unlike the first to the third embodiments, in which the at least one first mounting member 38 of the first bracket 24 (206, 314) is mounted to (or inserted into) the at least one first corresponding feature H1 of the first post 28a in the second direction D2, the at least one first mounting member 38 of the first bracket 502 in the fifth embodiment is mounted to (or inserted into) the at least one first corresponding feature H1 of the first post 28a in the first direction D1. Moreover, the locking portion 510 is not a portion of the locking member 506 of the locking device 504 but a portion of the elastic portion 508 (i.e., the elastic portion 508 has the locking portion 510). When the first bracket 502 is at the predetermined position P1 with respect to the rail member 500 and the locking device 504 is in the locking state S1, the locking member 506 of the locking device 504 blocks and is blocked by the first blocking feature 512 and the second blocking feature 514 of the rail member 500 through the locking portion 510 of the elastic portion 508, thereby preventing the first bracket 502 from being displaced from the predetermined position P1 in either of the first direction D1 and the second direction D2. In addition, the elastic member 516 applies to the first bracket 502 an elastic force that acts in the first direction D1 and hence biases the first bracket 502 in the first direction D1. This elastic force presses the end wall 518 of the first bracket 502 against the first post 28a in the first direction D1 to ensure that the at least one first mounting member 38 of the first bracket 502 is mounted securely or reliably to the at least one first corresponding feature H1 of the first post 28a. For example, the elastic force of the elastic member 516 enables the at least one first mounting member 38 of the first bracket 502 to stay inserted in the at least one first corresponding feature H1 of the first post 28a. The second bracket 520, on the other hand, has the at least one second mounting member 522 mounted to the at least one second corresponding feature H2 of the second post 28b.

According to the above, the slide rail assemblies disclosed in the foregoing embodiments preferably have the following technical features:

1. The first brackets in the foregoing embodiments are designed differently from the conventional slide rail brackets, which are kept from displacement from a certain position in a certain direction by a connecting element or fastening arm fastened to a post of a rack. Take the first embodiment of the present invention for example. When the first bracket 24 in the first embodiment is at the predetermined position P1 with respect to the rail member 22 and the locking device 44 is in the locking state S1, the locking device 44 blocks and is blocked by the blocking feature 42 to prevent the first bracket 24 from being displaced with respect to the rail member 22 from the predetermined position P1 in the first direction D1. Once the locking device 44 is brought out of the locking state S1 (e.g., into the unlocking state S2), the first bracket 24 is allowed to be displaced with respect to the rail member 22 from the predetermined position P1 in the first direction D1 (e.g., to the predetermined position P2).

2. When the first bracket 24 in the first embodiment is at the predetermined position P1 with respect to the rail member 22, not only can the locking device 44 in the locking state S1 and the blocking feature 42 block each other to prevent the first bracket 24 from being displaced with respect to the rail member 22 from the predetermined position P1 in the first direction D1, but also the elastic member 56 applies to the first bracket 24 an elastic force that acts in the second direction D2 (which is the opposite direction of the first direction D1) and thereby biases the first bracket 24 in the second direction D2. This configuration helps ensure that when the slide rail assembly of the first embodiment is applied to a rack post (e.g., the first post 28a), the at least one first mounting member 38 of the first bracket 24 will be mounted securely or reliably to the at least one first corresponding feature H1 of the first post 28a.

3. When the first bracket 24 in the first embodiment is at the predetermined position P1 with respect to the rail member 22 and the locking device 44 is in the locking state S1, the locking device 44 blocks and is blocked by the blocking feature 42 to prevent the first bracket 24 from being displaced with respect to the rail member 22 from the predetermined position P1 in the first direction D1; i.e., to block the first bracket 24 in a single direction. When the first bracket 206 (314, 402, 502) in the second (or the third, fourth, or fifth) embodiment is at the predetermined position P1 with respect to the rail member 200 (300, 400, 500) and the locking device 208 (306, 404, 504) is in the locking state S1, the locking device 208 (306, 404, 504) blocks and is blocked by the two blocking features 202 and 204 (302 and 304; 412 and 414; 512 and 514) to prevent the first bracket 206 (314, 402, 502) from being displaced with respect to the rail member 200 (300, 400, 500) from the predetermined position P1 in either of the first direction D1 and the second direction D2; i.e., to block the first bracket 206 (314, 402, 502) in two directions.

4. The locking member 308 in the third embodiment further includes the fastening portion 312 so that the at least one first mounting member 38 of the first bracket 314 can be mounted to the first post 28a even more securely or reliably.

5. When the first bracket 24 (206, 314) in the first (or the second or third) embodiment is at the predetermined position P1 with respect to the rail member 22 (200, 300) and the locking member 46 (210, 308) of the locking device 44 (208, 306) is in the locking state S1, the locking portion 46b (212, 310) of the locking member 46 (210, 308) blocks and is blocked by the blocking feature 42 (202, 302). In an alternative embodiment such as the fourth (or the fifth) embodiment, the locking member 406 (506) of the locking device 404 (504) blocks and is blocked by the blocking feature 412 (512) when the locking portion 410 (510) of the elastic portion 408 (508) is in the locking state S1.

6. When the first bracket 24 in the first embodiment is at the predetermined position P1 with respect to the rail member 22 and the locking device 44 is in the locking state S1, the locking device 44 and the rail member 22 are in an interfering relationship in which the locking device 44 is prevented from being displaced in the first direction D1; meanwhile, the elastic member 56 applies to the first bracket 24 an elastic force that acts in the second direction D2 (which is the opposite direction of the first direction D1). When the first bracket 502 in the fifth embodiment is at the predetermined position P1 with respect to the rail member 500 and the locking device 504 is in the locking state S1, the locking device 504 and the rail member 500 are in an interfering relationship in which the locking device 504 is prevented from being displaced in the second direction D2 (e.g., the locking portion 510 of the locking device 504 is blocked by the blocking feature 512); meanwhile, the elastic member 516 applies to the first bracket 502 an elastic force that acts in the first direction D1 (which is the opposite direction of the second direction D2). Either of the foregoing configurations helps mount the first bracket 24 (502) to a rack post (e.g., the first post 28a) in a secure or reliable manner.

While the present invention has been disclosed through the embodiments described above, it should be understood that the embodiments are not intended to be restrictive of the scope of the invention. The scope of patent protection sought by the applicant is defined by the appended claims.

What is claimed is:

1. A slide rail assembly, comprising:
   a rail member; and
   a first bracket, wherein the first bracket and the rail member are displaceable with respect to each other;
   wherein one of the rail member and the first bracket is provided with a blocking feature, and the other of the rail member and the first bracket is provided with a locking device;
   wherein the locking device includes a locking member pivotally displaceable between a locking state and an unlocking state relative to the blocking feature, the locking member including an operating portion defining a free terminal end for the locking member in both the locking and unlocking states thereof;
   wherein when the first bracket is at a predetermined position with respect to the rail member and the locking device is in the locking state, the locking device blocks and is blocked by the blocking feature to prevent the first bracket from being displaced from the predetermined position in a first direction.

2. The slide rail assembly of claim 1, wherein the one of the rail member and the first bracket is further provided with another blocking feature such that when the first bracket is at the predetermined position with respect to the rail member and the locking device is in the locking state, the locking device blocks and is blocked by said another blocking feature to prevent the first bracket from being displaced from the predetermined position in a second direction, wherein the second direction and the first direction are opposite directions.

3. The slide rail assembly of claim 2, wherein when the first bracket is at the predetermined position with respect to the rail member and the locking device is in the unlocking state, the locking device does not block and is not blocked by the blocking feature or said another blocking feature.

4. The slide rail assembly of claim 1, wherein when the first bracket is at the predetermined position with respect to the rail member and the locking device is in the unlocking state, the locking device does not block and is not blocked by the blocking feature, thus allowing the first bracket to be displaced from the predetermined position in the first direction.

5. The slide rail assembly of claim 1, wherein the locking device includes an elastic portion, and the locking member stays in the locking state in response to an elastic force of the elastic portion.

6. The slide rail assembly of claim 5, wherein the elastic portion includes a locking portion such that the locking member blocks and is blocked by the blocking feature through the locking portion of the elastic portion when in the locking state.

7. The slide rail assembly of claim 1, wherein the rail member is provided with an auxiliary base, the auxiliary base includes a channel, and the first bracket is displaceable with respect to the rail member through the channel.

8. The slide rail assembly of claim 1, further comprising an elastic member for applying to the first bracket an elastic force acting in a second direction, wherein the second direction and the first direction are opposite directions.

9. A slide rail assembly, comprising:
a rail member; and
a first bracket, wherein the first bracket and the rail member are displaceable with respect to each other;
wherein one of the rail member and the first bracket is provided with a blocking feature, and the other of the rail member and the first bracket is provided with a locking device;
wherein the locking device has a locking state;
wherein when the first bracket is at a predetermined position with respect to the rail member and the locking device is in the locking state, the locking device blocks and is blocked by the blocking feature to prevent the first bracket from being displaced from the predetermined position in a first direction;
wherein the locking device includes a locking member and an elastic portion, and the locking member stays in the locking state in response to an elastic force of the elastic portion;
wherein the locking member includes a locking portion and a fastening portion such that when the locking member is in the locking state, the locking portion blocks and is blocked by the blocking feature, with the fastening portion corresponding to an end wall of the first bracket.

10. A slide rail assembly adapted for a first post and a second post of a rack, the slide rail assembly comprising:
a rail member;
a first bracket, wherein the first bracket and the rail member are displaceable with respect to each other; and
a second bracket disposed on the rail member;
wherein the first bracket and the second bracket are configured to mount the rail member to the first post and the second post respectively;
wherein one of the rail member and the first bracket is provided with a blocking feature, and the other of the rail member and the first bracket is provided with a locking device;
wherein the locking device includes a locking member pivotally displaceable between a locking state and an unlocking state relative to the blocking feature, the locking member including an operating portion defining a free terminal end for the locking member in both the locking and unlocking states thereof;
wherein the first bracket includes at least one first mounting member, and the at least one first mounting member is configured to be inserted in at least one first corresponding feature of the first post when the first bracket is at a predetermined position with respect to the rail member;
wherein the locking device when in the locking state blocks and is blocked by the blocking feature to prevent the first bracket from being displaced from the predetermined position in a first direction, lest the at least one first mounting member of the first bracket separate from the at least one first corresponding feature of the first post.

11. The slide rail assembly of claim 10, wherein when the first bracket is at the predetermined position with respect to the rail member, the first post blocks the first bracket from being displaced in a second direction, wherein the second direction and the first direction are opposite directions.

12. The slide rail assembly of claim 11, further comprising an elastic member for applying an elastic force to the first bracket and thereby pressing the first bracket against the first post in the second direction.

13. The slide rail assembly of claim 10, wherein the second bracket includes at least one second mounting member configured to be inserted in at least one second corresponding feature of the second post, the first bracket is adjacent to an end portion of the rail member, and the second bracket is disposed on the rail member and is spaced apart from the end portion of the rail member.

14. The slide rail assembly of claim 10, wherein when the first bracket is at the predetermined position with respect to the rail member and the locking device is in the unlocking state, the locking device does not block and is not blocked by the blocking feature, thus allowing the first bracket to be displaced from the predetermined position in the first direction, and the at least one first mounting member of the first bracket to be consequently separated from the at least one first corresponding feature of the first post.

15. The slide rail assembly of claim 10, wherein the locking device includes an elastic portion, and the locking member stays in the locking state in response to an elastic force of the elastic portion.

16. The slide rail assembly of claim 15, wherein the elastic portion includes a locking portion such that the locking member blocks and is blocked by the blocking feature through the locking portion of the elastic portion when in the locking state.

17. A slide rail assembly adapted for a first post and a second post of a rack, the slide rail assembly comprising:
a rail member;
a first bracket, wherein the first bracket and the rail member are displaceable with respect to each other; and
a second bracket disposed on the rail member;
wherein the first bracket and the second bracket are configured to mount the rail member to the first post and the second post respectively;

wherein one of the rail member and the first bracket is provided with a blocking feature, and the other of the rail member and the first bracket is provided with a locking device;

wherein the locking device has a locking state;

wherein the first bracket includes at least one first mounting member, and the at least one first mounting member is configured to be inserted in at least one first corresponding feature of the first post when the first bracket is at a predetermined position with respect to the rail member;

wherein the locking device when in the locking state blocks and is blocked by the blocking feature to prevent the first bracket from being displaced from the predetermined position in a first direction, lest the at least one first mounting member of the first bracket separate from the at least one first corresponding feature of the first post;

wherein the locking device includes a locking member and an elastic portion, and the locking member stays in the locking state in response to an elastic force of the elastic portion;

wherein the locking member includes a locking portion and a fastening portion such that when the locking member is in the locking state, the locking portion blocks and is blocked by the blocking feature, with the fastening portion fastened to the first post.

18. A slide rail assembly, comprising:

a rail member;

a first bracket disposed adjacent to an end portion of the rail member, wherein the first bracket includes at least one first mounting member and is displaceable with respect to the rail member;

a second bracket disposed away from the end portion of the rail member, wherein the second bracket includes at least one second mounting member;

an elastic member for applying an elastic force to the first bracket; and a locking device including a locking member pivotally coupled to the first bracket to displace between a locking state and an unlocking state relative to the rail member, the locking member including an operating portion defining a free terminal end for the locking member in both the locking and unlocking states thereof.

19. The slide rail assembly of claim 18, wherein when the first bracket is at a predetermined position with respect to the rail member and the locking device is in the locking state, the locking device and the rail member are in an interfering relationship such that the locking device is prevented from being displaced in a first direction, and the elastic member applies to the first bracket an elastic force acting in a second direction, wherein the second direction and the first direction are opposite directions; and when the first bracket is at the predetermined position with respect to the rail member and the locking device is in the unlocking state, the locking device and the rail member are not in the interfering relationship such that the locking device is allowed to be displaced in the first direction.

* * * * *